United States Patent [19]

Banerji et al.

[11] Patent Number: 5,166,774
[45] Date of Patent: Nov. 24, 1992

[54] SELECTIVELY RELEASING CONDUCTIVE RUNNER AND SUBSTRATE ASSEMBLY HAVING NON-PLANAR AREAS

[75] Inventors: Kingshuk Banerji, Plantation; Anthony B. Suppelsa, Coral Springs; William B. Mullen, III., Boca Raton, all of Fla.

[73] Assignee: Motorola, Inc., Schaumburg, Ill.

[21] Appl. No.: 593,410

[22] Filed: Oct. 5, 1990

[51] Int. Cl.⁵ .................. H01L 39/02; H01L 23/48
[52] U.S. Cl. .................... 361/398; 361/400; 361/404; 361/408; 439/67; 439/77; 257/668; 174/253
[58] Field of Search .......... 357/80, 81, 74, 68, 357/66, 71; 361/400, 404, 398, 408; 174/68.5; 439/67, 77

[56] References Cited

U.S. PATENT DOCUMENTS

| | | | |
|---|---|---|---|
| 3,487,541 | 1/1970 | Boswell | 357/80 |
| 3,519,890 | 7/1970 | Ashby | 361/408 |
| 4,728,751 | 3/1988 | Canestaro et al. | 174/68.5 |

Primary Examiner—Rolf Hille
Assistant Examiner—David Ostrowski
Attorney, Agent, or Firm—M. Mansour Ghomesi

[57] ABSTRACT

A selectively releasing runner and substrate assembly 100 comprises a plurality of conductive runners 116 adhered to a substrate 112, a portion 118 of at least some of the conductive runners 116 have non-planar areas with the substrate 112. Additionally the portion 118 has a lower adhesion to the substrate for selectively releasing the conductive runner 118 from the substrate 112 when subjected to a predetermined stress.

8 Claims, 4 Drawing Sheets

SELECTIVELY RELEASING CONDUCTIVE RUNNER AND SUBSTRATE ASSEMBLY HAVING NON-PLANAR AREAS

TECHNICAL FIELD

This invention relates generally to the field of substrate and runner assemblies, and more specifically to a method of directly attaching an electronic component such as a semiconductor die to a substrate while reducing the stresses associated with the metalization interconnections between the substrate and the electronic component.

BACKGROUND

Direct die attachment to a substrate such as a molded printed circuit board, a printed circuit board, or a flexible circuit board is known in the art. This attachment scheme has reliability issues associated with the Thermal Coefficient of Expansion (TCE) mismatch between the die and substrate. The TCE mismatch can cause the solder interconnected to eventually crack or otherwise break the integral connections between the die and the substrate. For example, a semiconductor die has a TCE of 2.8 to 4.6 while a glass filled printed circuit board has a TCE that ranges from 8 to 45. Temperature fluctuations will cause the die to expand and contract at a different rate than the printed circuit board, thereby causing catastrophic stresses in the die interconnect metalizations. One approach for relieving stress is illustrated in U.S. Pat. No. 3,487,541 to Boswell, which teaches a process for manufacturing flexible contact fingers. A need exists for a simplified method of directly attaching a die to a substrate that overcomes the problems resulting from different coefficients of expansion and contraction of the substrate and die.

SUMMARY OF THE INVENTION

Briefly, according to the invention, a selectively releasing runner and substrate assembly has low stress interconnect metalization for direct component attachment to metalized conductive runners on a substrate that will self-release under an applied stress. A portion of the metalized conductive runners having non-planar areas with the substrate, minimizes stress transmitted to the interconnection between the runners and the die by selectively releasing from portions of the substrate while maintaining the interconnection between the die and the runners.

DETAILED DESCRIPTION OF THE PREFERRED EMBODIMENT

Figure 1:
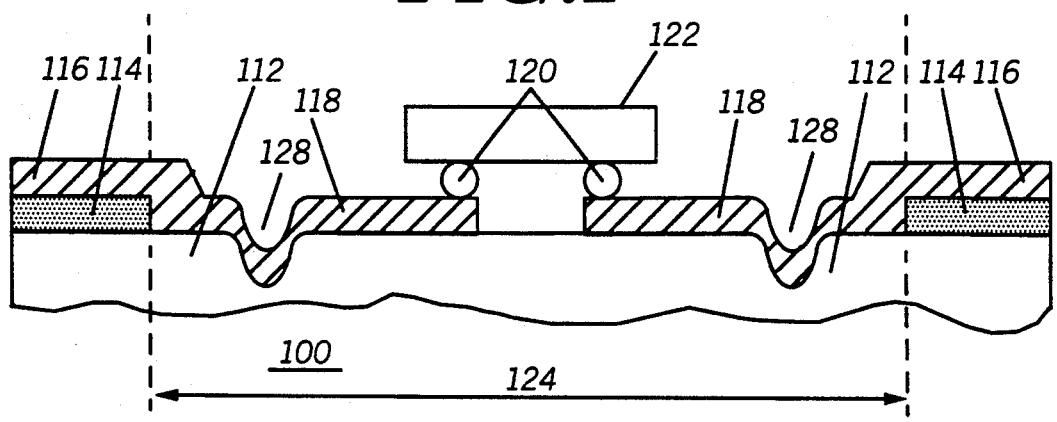
FIG. 1 is a cross sectional view of a selectively releasing runner and substrate assembly (unaffected by stress) with valleys in accordance with the present invention.

Referring to FIG. 1, there is shown a cross-sectional view of a selectively releasing runner and substrate assembly 100 in accordance with the present invention. A metal adhesive layer 114 such as chromium, nichrome, nickel, or titanium is deposited on a substrate 112 for providing maximum adhesion between the substrate 112 and a conductive runner 116. The substrate 112 has a number of indentations, incurvations, or valleys 128. The conductive runner 116 has portions 118 wherein the conductive runner directly attaches to the substrate 112, thereby providing minimal adhesion to the substrate 112 due to the absence of the adhesive layer 114. The stress release zone 124 is the area the conductive runner portion 118 directly attaches to the substrate. In the stress release zone 124 the runner portion 118 conforms to the contours of the valleys 128. This conformation produces the non-planar area of the runner portion 118 with the substrate 112. An electronic component 122 such as a semiconductor die or chip carrier is mechanically and electrically coupled to the selectively releasable conductive runner portion 118 by using an agent such as solder 120. The selective releasing of a runner from a substrate is further discussed in U.S. patent application Ser. No. 07/486,999, filed Mar. 1, 1990 the disclosure of which is hereby incorporated by reference.

Figure 2:
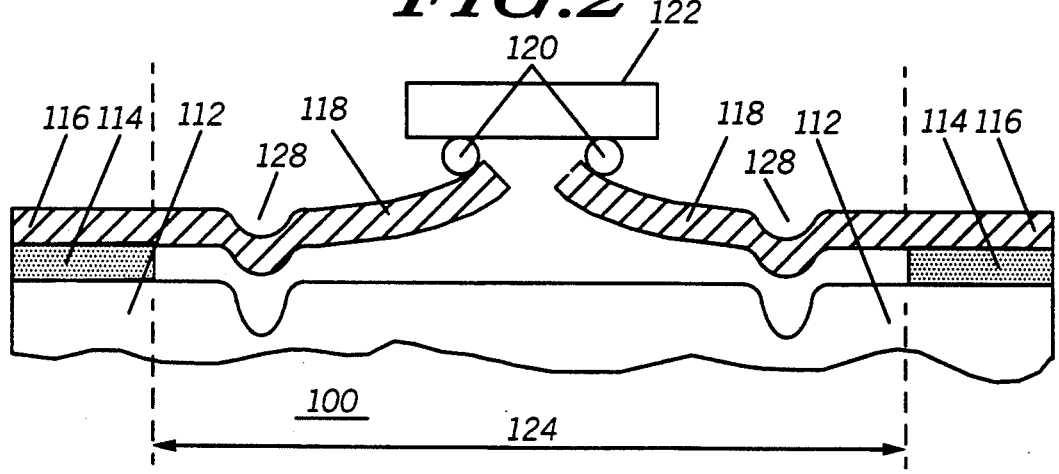
FIG. 2 is a cross sectional view of the selectively releasing runner and substrate assembly with valleys of FIG. 1 (affected by stress).

Referring to FIG. 2 the selectively releasing runner and substrate assembly 100 with valleys is shown under stress, namely temperature. As is known in the art, with variations in temperature the conductive runners expand and contract at a different rate than that of the substrate 112. To accommodate this differential in expansion and contraction the conductive runner portion 118 releases from the substrate 112 in the area of the stress release zone 124 while maintaining maximum adhesion in the remainder of the conductive runner 116 where the adhesive 114 couples it to the substrate 112. The additional surface of the valleys 128 provides a spring action for the runner 118 thereby minimizing any stressful pulling on the solder contact point 120. This spring action renders the electro-mechanical coupling of the die 122 and the metalized runners 118 more flexible. This extended flexibility renders the direct coupling of semiconductor dice to circuit carrying substrates possible.

Referring to FIGS. 3A-H, the steps or process for manufacture of a selectively releasing runner and substrate assembly 300 are illustrated. A flat substrate 332, preferably comprising; ceramic, flexible circuitry, printed circuit board, or molded printed circuit board is provided. The ceramic is typically alumina, beryllia, steatite, aluminum nitride, or barium titanate. The substrate for the flexible circuit board is typically comprised of polyimide, polyester, fiber filed paper, or polyamide film that are sold by Dupont with the names Kapton ®, Mylar ®, Aramid ®, or Nomex ® respectively. The printed circuit board substrates are typically comprised of filled or unfilled polyimide, FR4 (a flame retardant resin), BT, or Cyanate-Ester. The substrate for the molded printed circuit board is typically comprised of a filled or unfilled high temperature thermoplastic such as polyetherimide material sold by General Electric with the name of ULTEM ®. Other materials such as PEEK, PET, Polycarbonate, or ABS may be used in the manufacturing of molded printed circuit boards using this invention.

Figure 3A:
FIG. 3A through 3H are cross-sectional views of the steps for manufacturing a selectively releasing runner and substrate assembly in accordance the present invention.

In applications where the formation of a valley is preferred, an indentation with angled sides with depth of 5 to 15 mils is incorporated around the die site on the substrate 332 provided in FIG. 3A. The indentation may be produced by utilizing a tool on the laminating presses which when used in laminating the B-stage prepreg will leave the desired impression on the substrate 332 when fully cured. In some applications Eximer laser may be utilized to form a groove on the substrate 332.

Figure 3B:
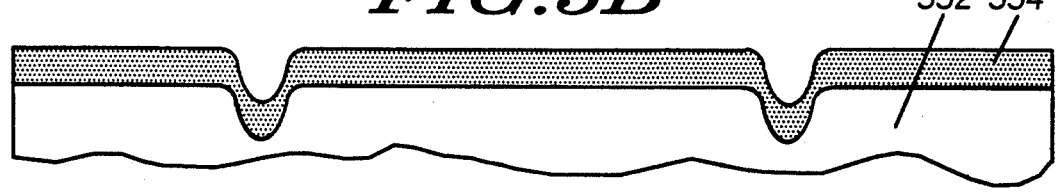
Figure 3C:
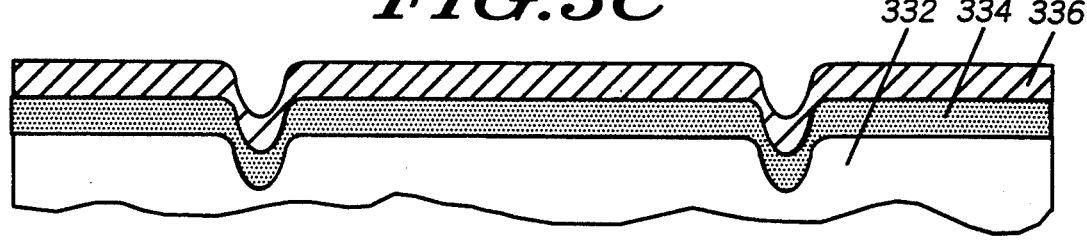

The substrate 332 with its newly produced valleys, collectively referred to as substrate 333, is preferably cleaned, to remove contamination, by first using hot detergent and water, and then by plasma cleaning. In FIG. 3B, an adhesion layer 334 of metal such as chromium, titanium, nichrome, or nickel is preferably sputter deposited or vacuum deposited onto the substrate 333. The metal layer 334 is preferably 2 to 3 microinches thick. In FIG. 3C, a metal layer 336, typically copper of about 10 micro-inches, is preferably sputter deposited over the adhesion layer 334, creating maximum bonding between the metal layer 336 and the substrate 333.

Figure 3D:
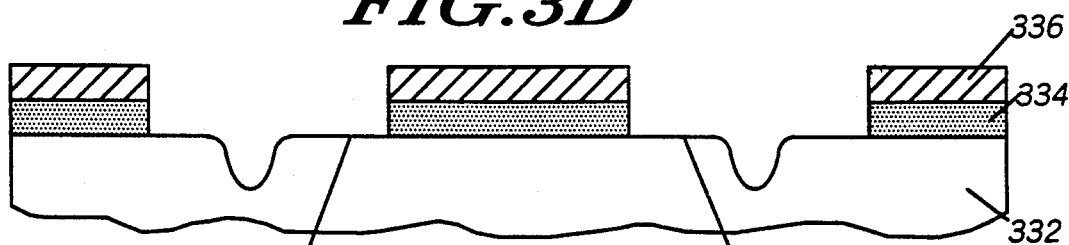
Figure 3E:
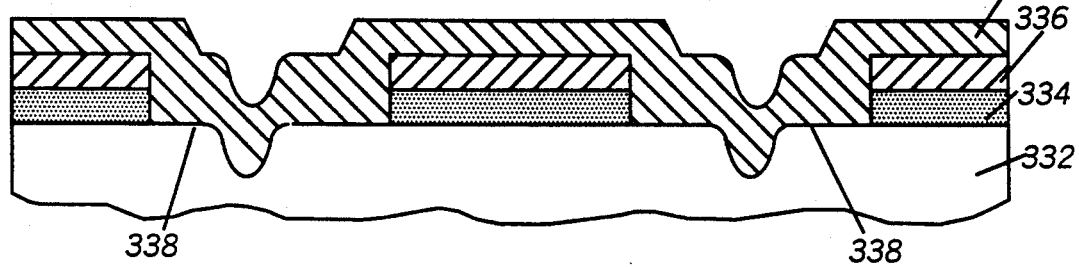
Figure 3F:
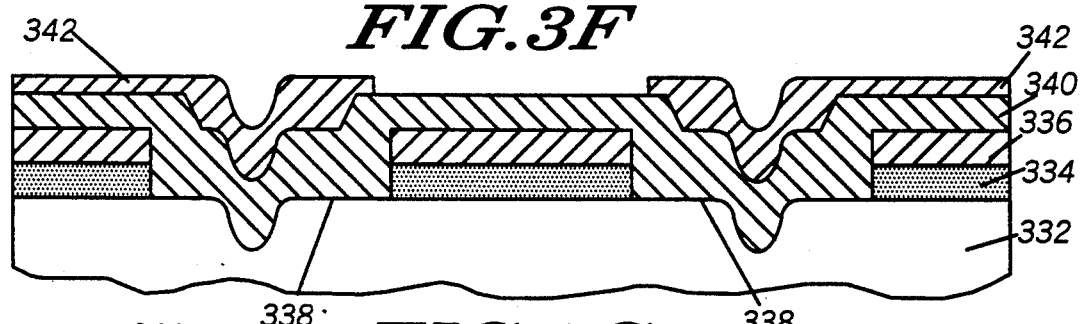
Figure 3G:
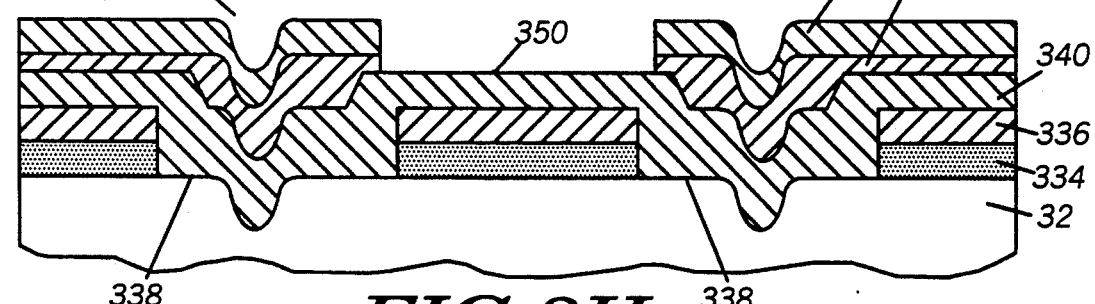
Figure 3H:
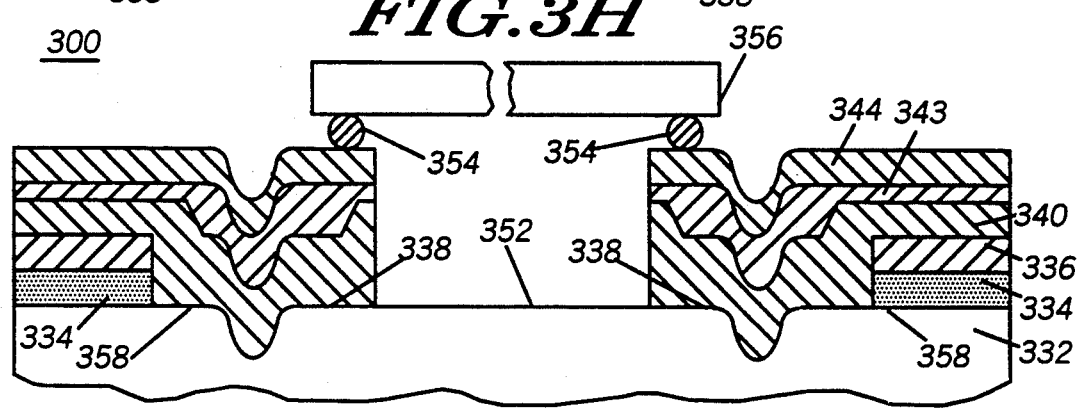

In FIG. 3D, areas 338 requiring minimal or no adhesive strength on the runner and substrate assembly 330 are defined (preferably by using photoresist) and removed by using any of the well known methods including chemical etching, sputter etching, reactive ion etching, or ion beam milling. The areas 338 expose the bare substrate having minimal or no adhesion after the removal of portions of the metal adhesive 334 and the metal layer 336. In FIG. 3E, the photoresist is removed and then another layer of metal 340, preferably copper, is sputtered over the entire substrate including the areas 338 where the substrate 333 was exposed. This layer assists in plating of the circuit pattern. In FIG. 3F, areas where the metal runners are desired are defined or delineated, preferably using photoresist techniques. Furthermore, the areas delineated for metal runners are electroplated with metal, preferably copper with a thickness of 1 mil, forming layer 342. In FIG. 3G, the electroplated layer 342 is over plated with nickel and gold indicated by layer 344. In FIG. 3H, the photoresist used in FIG. 3F is removed, and the areas 350 that were not electroplated or overplated are preferably etched back to the substrate, exposing area 352 of the substrate 333. Finally solder 354 is applied to the top surface of the metal runners 344 in order to mechanically and electrically attach an electronic component such as a die 356 or a ceramic chip carrier.

If the selectively releasing runner and substrate assembly 300 is subjected to stresses associated with the different temperature coefficients of expansion, then the portions of the metal runners on the areas 338 on the substrate 333 (where minimal adhesion is desired) will release from the substrate 333. Indeed a portion of the metal runners 344 over the bumps (or valleys) 300 will act as a spring and will expand and contract freely without putting any significant pressure on the integral contact between the die 356, the solder 354, and the runner 344. Meanwhile, the areas 358 (where maximum adhesion is desired) having the adhesion layer 334 does not release the portions of the metal runners bonded above the adhesion layer 334, thereby maintaining the electrical connection between the die 356 and the rest of the components on a circuit carrying substrate 400.

Figure 6:
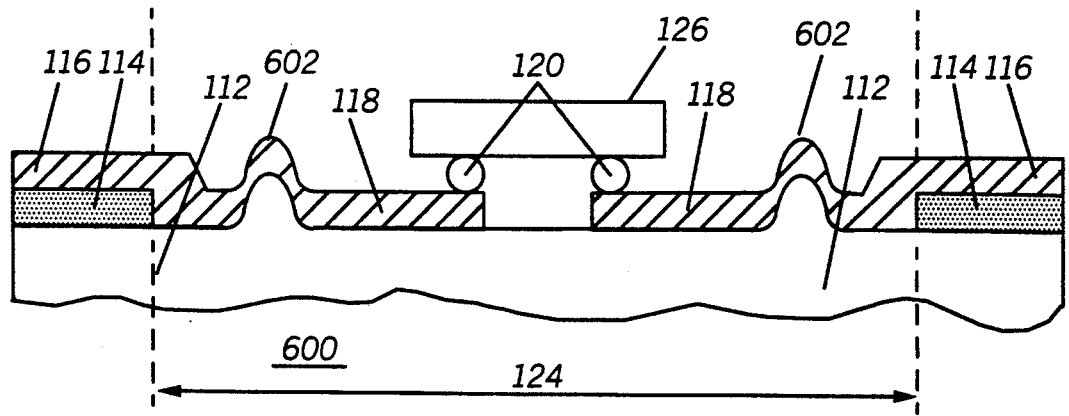
FIG. 6 is a cross sectional view of a selectively releasing runner and substrate assembly (unaffected by stress) with bumps in accordance with the present invention.

The non-planar area of the conductive runner portion 118 with the substrate 112 may be formed by a salient, a cusp, or a bump in the substrate 112 thereby providing a spring portion. This is shown by a selective releasing runner and substrate assembly 600 in FIG. 6. All the layers of the substrate assembly 600 are similar to those of the substrate assembly 100. The only difference is the use of bumps 602 instead of valleys 128. The substrate 112 of the assembly 600 may be treated with an epoxy to produce one or several elevated rings to form salient, cusps, or bumps as necessitated by the circuit requirements. The material of the epoxy is of high enough viscosity so that it does not slump significantly after application. Common material would be those used for dams in restricting the flow of low viscosity polymers. The epoxy is dispensed using a syringe like applicator and subsequently cured so that a permanent bump is produced close to the die solder pads.

Figure 7:
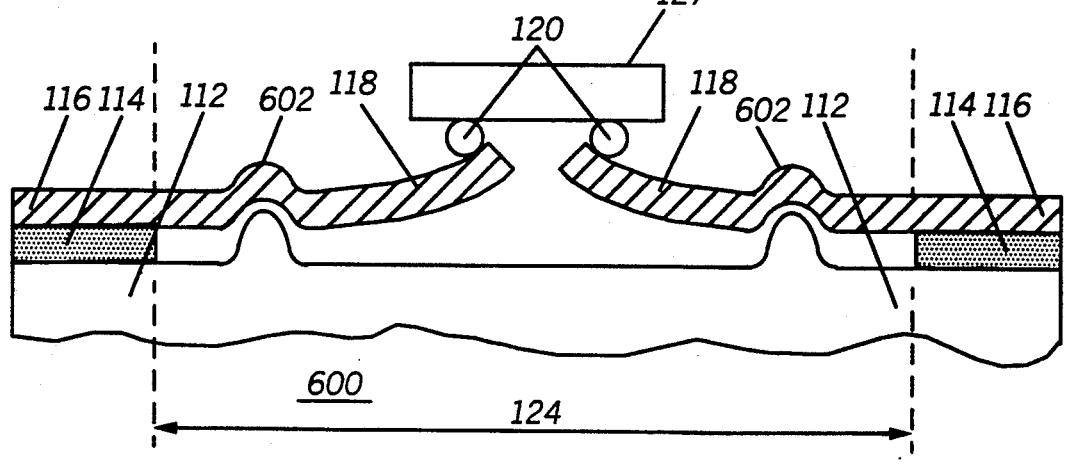
FIG. 7 is a cross sectional view of the selectively releasing runner and substrate assembly with bumps of FIG. 6 (affected by stress).

FIG. 7 shows the selective releasing runner and substrate assembly 600 with bumps 602 affected by stress. The effectiveness of the bumps 602 is similar to the valleys 128 of the substrate assembly 100. As shown in FIG. 7 excessive expansion of the runner 116 is absorbed by the bumps 602 thereby minimizing the stress on the solder joints 120.

The use of indentations, incurvations, or valleys helps primarily in applications where significant contraction is expected. On the other hand salients, cusps, or bumps accommodate expansions more effectively. Some applications may demand the combination of both bumps and valleys to minimize the effects of stress whether contraction or expansion. In such applications a bump may follow a valley or vice versa. The substrate assemblies 100 and 600 have increased applications in the flip chip technology where a die is flipped and directly coupled to a circuit carrying substrate.

Figure 4:
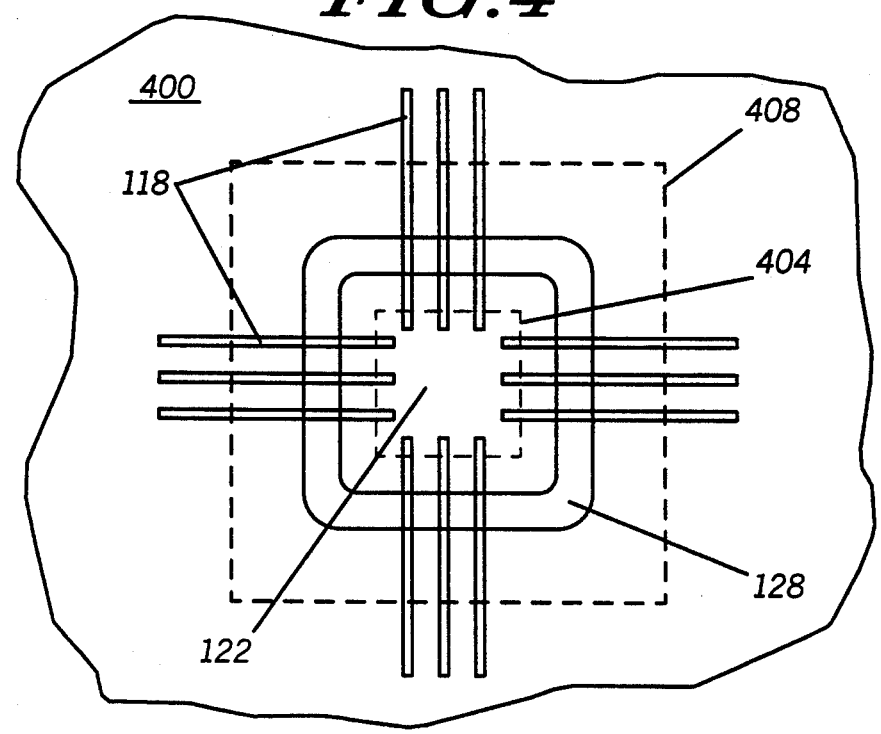
FIG. 4 is a top plan view of the selectively releasing runner and substrate assembly in accordance with the present invention.

Referring to FIG. 4, a top plan view of a selectively releasing runner and substrate assembly 400 is shown in accordance with the present invention. The die 122 is shown by its outline 404 while the demarkation of metal with no or low adhesion and the maximum adhesion area of the substrate is shown by an outline 408. The sputtered metal runners 118 provide electrical contact between the die 122 and the rest of the circuit components on the circuit carrying substrate 400. As can be seen the ring created around the die 122 by the bump (or valley) 602 (128) creates a relief zone for the expansion or contraction of the circuit carrying substrate 400. Furthermore, the thinner dimensions of runners afforded by the use of bumps 602, valleys 128, or both allows for the optimum area utilization so desirable in radio communication devices.

Figure 5:
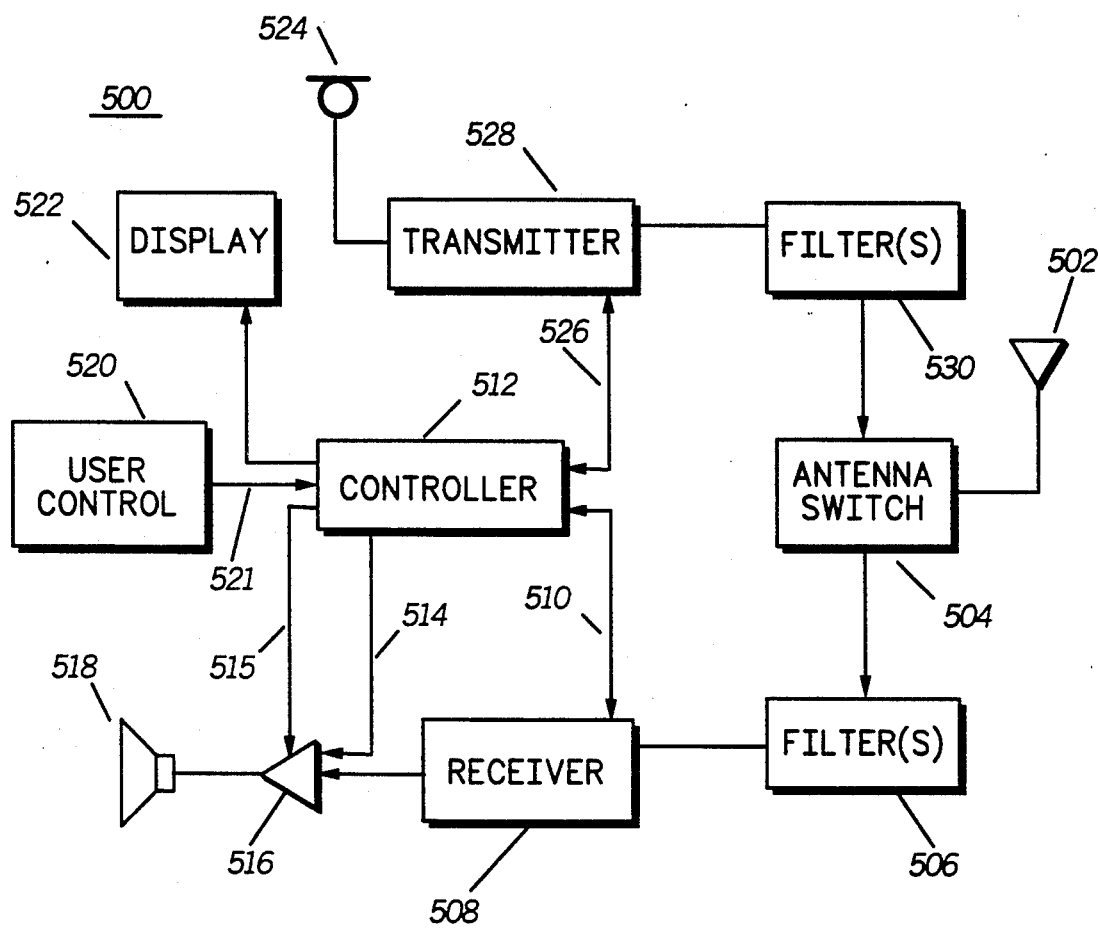
FIG. 5 is a block diagram of a communication device in accordance with the present invention.

Referring to FIG. 5, a radio communication device 500 in accordance with the present invention includes an antenna switch 504 that can selectively couple the antenna 502 to either a receiver 508 via filter(s) 506 or a transmitter 528 via filter(s) 530. The elements of the radio communication device 500 include at least one selectively releasing runner and substrate assembly, such as the assemblies 100 or 600 illustrated earlier.

To receive a message, a radio frequency signal is routed from an antenna 502 to a receiver 508 via the antenna switch 504 and a filter(s) 506. The receiver 508 may be of conventional design. The receiver 508 provides data messages to the controller 512 via data line 510. Typically, the controller 512 operates to alert the radio user and present a received message in a variety of ways depending upon the message type and optional features that may be enabled or disabled by the radio user. Thus the controller 512 may send an alert signal to an amplifier 516, via data line 514, to be presented to the radio operator via the speaker 518. After the alert, a voice message may be provided by the receiver 508 to the amplifier 516 for presentation via the speaker 518. Data messages would follow the radio's address code to the controller 512 via data line 510. Such messages are subsequently analyzed by the controller 510 and if appropriate sent to a display 522 for presentation.

Optionally the present invention can be applied to the transmitter section 528 of the radio communication device 500. To transmit a signal, a voice message is routed from the microphone 524 to the transmitter 528 for transmission via the antenna 502 through filter(s) 530 and antenna switch 504. Data messages are processed by the controller 512 and are subsequently presented to the transmitter 528 for transmission via the antenna 502 through filter(s) 530 and antenna switch 504.

The use of the selectively releasing runner and substrate assembly 100 (600) in the receiver 508, the transmitter 528 or any other circuit block of the radio 500 renders the radio 500 more reliable.

What is claimed is:

1. A circuit-carrying substrate assembly, comprising:
   a substrate having a surface including a plurality of non-planar valleys extending into and below the substrate surface; and
   a plurality of runners attached to said substrate, a first portion of at least some of said plurality of runners having substantially less adhesion to said substrate than the rest, said first portion being at least partially disposed on said valleys, for providing said plurality of runners with a spring action in order to selectively release said plurality of runners from said substrate when subjected to stress.

2. A selectively releasing runner and substrate assembly, comprising:
   a substrate having a surface including a plurality of non-planar bumps extending out of and above the substrate surface; and
   a plurality of conductive metalized runners adhered to said substrate, a portion of at least some of said metalized conductive runners having substantially less adhesion to the substrate than the rest, the first portion being at least partially disposed on said bumps, for selectively releasing said runners from said substrate when stress is applied to said assembly.

3. A communication device, comprising:
   radio circuitry for receiving and/or transmitting radio frequency signals and including a plurality of circuit components;
   at least one circuit-carrying substrate assembly constructed and arranged to accommodate at least a portion of the radio circuitry, said circuit-carrying substrate assembly comprising:
   a substrate having a surface including a plurality of non-planar bumps extending out of and above the substate surface; and
   a plurality of conductive metalized runners adhered to said substrate, a portion of at least some of said metalized conductive runners having substantially less adhesion to the substrate than the rest, the first portion being at least partially disposed on said bumps for selectively releasing said runners from said substrate when stress is applied to said assembly.

4. The communication device of claim 2, wherein said at least one component comprises a circuit component having a temperature coefficient of expansion and contraction different than that of the circuit carrying substrate.

5. The communication device of claim 2, wherein said at least one component comprises a semiconductor die.

6. The communication device of claim 2, wherein said at least one component comprises a chip carrier.

7. The communication device of claim 2, wherein said circuit carrying substrate comprises flexible substrates.

8. The communication device of claim 2, wherein said at least one component comprises a ceramic based circuit component.

* * * * *